Sept. 26, 1967 G. R. CRONIN 3,344,071
HIGH RESISTIVITY CHROMIUM DOPED GALLIUM ARSENIDE AND PROCESS OF MAKING SAME
Filed Sept. 25, 1963
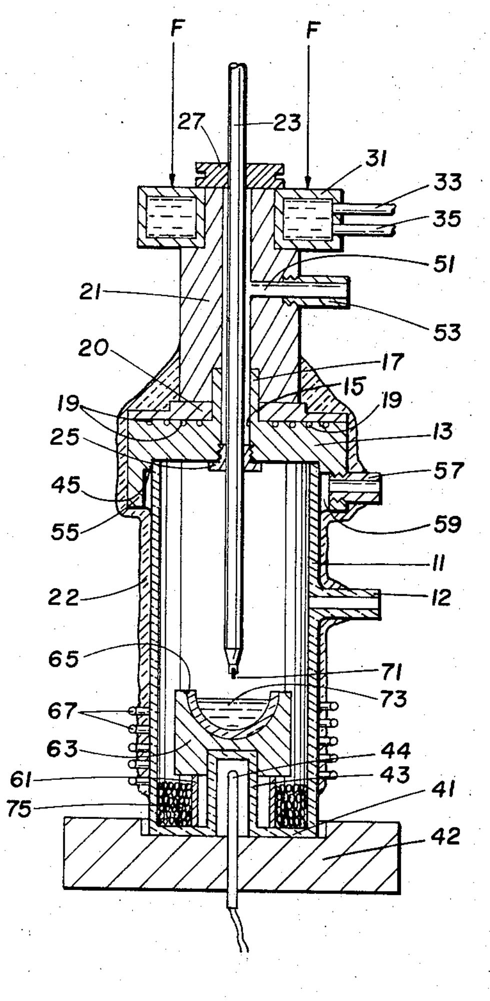
GEORGE R. CRONIN
INVENTOR.
BY William D. Harris, Jr.

United States Patent Office 3,344,071
Patented Sept. 26, 1967

3,344,071

HIGH RESISTIVITY CHROMIUM DOPED GALLIUM ARSENIDE AND PROCESS OF MAKING SAME

George R. Cronin, Dallas, Tex., assignor to Texas Instruments Incorporated, Dallas, Tex., a corporation of Delaware Filed Sept. 25, 1963, Ser. No. 311,430
6 Claims. (Cl. 252—62.3)

This invention relates to crystalline gallium arsenide of high resistivity and a process for making same.

Gallium arsenide crystal possesses utility as a semiconductor material, being used in various semiconductor devices, including certain types of transistors.

A technique of increasing importance in the art of forming semiconductor devices is the epitaxial process of crystal growth wherein a layer of the desired semiconductor crystal is grown upon a substrate. The substrate must be of substantially monocrystalline structure in order that the layer formed upon it be monocrystalline. In some instances it is desired that the substrate be of low resistivity. On the other hand, in other instances it is desirable that the substrate be of high resistivity. A single substrate slice from a crystal of high resistivity may be used as the common substrate for a multiplicity of individual epitaxial crystal units grown upon its surface. Although all such epitaxial units are individually united with the substrate in a generally monocrystalline structure, the high resistivity of the substrate effectively electrically isolates the individual units. Further processing of the individual units, by epitaxial growth or other processes, for example diffusion, makes possible the construction of a multiplicity of semiconductor devices all upon the same single substrate that are substantially electrically isolated. Such electrical connections and interconnections can thereafter be made as are desired for the specific application at hand.

It is an object of this invention to provide monocrystalline gallium arsenide of high resistivity; moreover, to provide such gallium arsenide that has utility as a high resistivity substrate. It is an additional object of this invention to provide a method for making high resistivity gallium arsenide of monocrystalline structure.

In accordance with this invention, a high resistivity crystal is provided which consists essentially of a major proportion of gallium arsenide and a minor proportion of chromium.

In a more specific aspect, this invention provides a gallium arsenide crystal having a low level of electrically active donor impurities present and a quantity of chromium in excess of said electrically active impurities, the crystal having a resistivity on the order of $10^8$ ohm-centimeters.

Ordinarily, when high purity gallium and arsenic are compounded to form gallium arsenide, the resultant material is of low resistivity and N-type due to residual donor impurities. Thus, the addition of chromium, which acts in a manner likened to an acceptor with a high energy level in gallium arsenide, compensates and swamps the effect of the original donor but does not itself provide low energy gap carriers. If the material is originally P-type, which is unusual, a quantity of donor impurity, such as sulfur, selenium or tellurium, would be added to render the material N-type or essentially compensated, or else the acceptor-like nature of the chromium would prevent the desired result from being accomplished. Accordingly, in another specific aspect, the invention provides a gallium arsenide crystal having a low level of donor or acceptor impurities (so long as the donor predominates) and a quantity of chromium in excess of such impurities.

This invention further includes a process for making gallium arsenide wherein a minor proportion of residual electrically active impurities is ordinarily present, including the step of introducing into the growing crystal a quantity of chromium at least as great as a level just in excess of the electrically active impurities normally present.

In a specific preferred embodiment this invention provides a process for growing a single high resistivity crystal of gallium arsenide by pulling the crystal from a melt of gallium arsenide, wherein liquid gallium is raised to the melting temperature of gallium arsenide and arsenic vapor is maintained in the proximity of the gallium to unite therewith to form a melt of gallium arsenide, including the step of introducing a minor proportion of chromium into the gallium arsenide melt.

For a more complete understanding of the present invention and for further objects and advantages thereof, reference may now be had to the following description taken in conjunction with the accompanying drawing in which the sole figure is a schematic diagram, represented in cross section, of an apparatus suitable for the manufacture of a crystal of gallium arsenide.

Referring now to the figure, the apparatus illustrated therein includes a quartz chamber 11, which has tubular side arm 12 to permit communication therethrough to the interior of the chamber. Lid 13 covers the upper open portion of chamber 11. Lid 13 is made of boron nitride. It has an aperture 15 which passes through its central portion, and through the central portion of its upwardly extending hub 17. A resistance heater coil 19 is disposed along the upper portion of lid 13, which is fitted with boron nitride retainer cap 20 to enclose said heater coil and hold it in position. Power is fed to coil 19 by suitable leads, not illustrated.

Upper annular cylindrical member 21 rides on hub 17, concentric therewith, and rests upon retainer cap 20. Upper member 21 is also made of boron nitride.

Insulation 22, of quartz fiber batting, for example, surrounds the outer portions of chamber 11 and cap 13.

A quartz pull rod 23, axially rotatable by means not shown at speeds in the range of 20–30 r.p.m., extends downwardly through the central cavity defined in annular upper cylindrical member 21 and in cap 13, including hub 17, with its lower end inside of chamber 11. The rod 23 has lower support provided by graphite bearing 25 and upper support by Teflon bearing 27, which bearings also serve as partial seals. Teflon bearing 27 is held in fixed position by a clamp or other conventional means, not illustrated.

Annular water cooled jacket 31, with water feed line 33 and water outlet line 35, is located concentric with a diametrically reduced top portion of upper member 21, just under Teflon bearing 27. Jacket 31 provides cooling for Teflon bearing 27.

The lower portion of the chamber 11 is closed by bottom 41, which rests upon a circular recessed surface on the upper portion of base 42. Bottom 41 has central thermocouple receiving well 43 extending upwardly in its mid portion. Thermocouple 44 runs upwardly through base 42, with its junction in well 43.

Cap 13 may be supported against the upper edge portions of chamber 11 by its weight and the weight of the members resting on it; however, it preferably is held more firmly in place by application of external force by any convenient means, indicated, in effect, by arrows F representing external loads applied on top of jacket 31.

To assist in the engagement of cap 13 with chamber 11, the cap is bored to provide inner shoulder 45, which is dimensioned to fit closely adjacent the upper peripheral portions of chamber 11 while cap 13 rests upon the upper end of chamber 11.

Provisions for preventing air from entering chamber 11 through the partial seals provided by bearings 25 and 27 and through the partial seal provided by the seating of cap 13 on chamber 11 will now be discussed. Upper annular member 21 is provided with a transverse passage 51, which is threaded to receive nipple 53. Nipple 53 and passage 51 thus permit communication therethrough to the central cavity in 21. Cap 13 has a depending annular skirt portion 55 in which is formed a passage receiving transversely oriented nipple 57. The internal diameter of skirt portion 55 is greater than the outer diameter of chamber 11 to define an annular cavity 59, with insulation 22 as the bottom surface bounding said cavity and the lower portion of shoulder 45 as the top bounding surface thereof. It will be noted that nipple 57 permits communication therethrough with the annular cavity 59. Both nipples 53 and 57 are connected to a supply of argon gas, not illustrated. When argon gas is permitted to flow through these nipples, air in the central cavity in upper annular member 21 and in annular cavity 59 is purged therefrom and replaced by an inert atmosphere of argon. Continuous flow of argon gas is permitted by the small amount of leakage occurring through the partial seal between Teflon bearing 27 and pull rod 23 and by leakage through the relatively porous insulation 22 defining the bottom surface bounding annular cavity 59. A protective envelope of argon is thus provided to keep out air.

Quartz support ring 61 extends upwardly from bottom wall 41 to support graphite susceptor 63, a generally cylindrical member having a hemispherical recess formed in its top which snugly receives hemispherical alumina cup 65. Note also that thermocouple well 43 extends upwardly into a recessed receiving portion in the bottom of graphite susceptor 63.

External of quartz chamber 11, but closely adjacent the walls thereof in the proximity of graphite susceptor 63, is RF heating coil 67.

The end of quartz pull rod 23 carries a small crystal of gallium arsenide, indicated at numeral 71, to serve as a seed for crystal growth. Crystal 71 is maintained in position by engagement in a slot in the end of the rod. A quartz pin passing through the end of the rod and through a mating opening formed in the seed may be used, if desired, to insure that the crystal stays in place.

The crucible 65 contains liquid gallium charge 73. Solid metallic arsenic 75 is disposed in the lower portions of the chamber 11 resting on bottom 41.

The above-described apparatus of the figure may be used to pull gallium arsenide crystals. The formation of such crystals that do not contain chromium is no part of this invention; however, the described apparatus may be used to make novel high resistivity crystals by the introduction of chromium, as will now be described.

In operation, starting at room temperature, gallium 73 is placed in alumina cup 65 and chromium is added thereto. Elemental metallic arsenic 75 is placed in the bottom of chamber 11. The apparatus described with reference to the figure is then assembled as indicated therein with porous insulation 22 being applied.

Argon gas is introduced through side arm 12 and through nipples 53 and 57.

After purging air in chamber 11 by the argon for a suitable time, for example 15 minutes, then side arm 12 is sealed off, as by an oxyhydrogen torch. The flow of argon into nipples 53 and 57 is allowed to continue throughout the process. RF coil 63 is energized by a conventional energy source, not shown. Temperature is measured by thermocouple 44. Heating is continued over a period of about an hour until the melting point of gallium arsenide (1240° C.) or slightly above, preferably about 1250° C., is reached. The heat radiated from graphite susceptor 63 during the course of processing evaporizes the solid metallic arsenic 75 and reaction proceeds between the liquid gallium and the arsenic to form a melt of gallium arsenide. Thereafter, the rod 23 is moved downward until the crystal 71 contacts the surface of the gallium arsenide melt, which is at this time present in cup 65. The rod 23 is then retracted slowly, for example about 1½" per hour. During the course of this process of retraction the rod 23 is rotated at a spin rate of about 25–30 r.p.m. The temperature of the gallium arsenide melt is maintained at about 1240° C. during the course of the crystal pulling process.

All through the course of processing, the resistance heater 19 is operated to maintain the boron nitride surface at, or above, the condensation temperature of the vapor, thus maintaining an equilibrium pressure of the volatile component over the reaction melt in cup 65. Note that the system described does not depend on a gas-tight chamber. The loss of vapor through leaks is sufficiently slow to allow the growth of a large single crystal and the argon system provides an inert gas to insure air is kept out. The pressure throughout processing is essentially atmospheric.

By the foregoing technique a crystal of gallium arsenide starts growing on the seed crystal 71 and continues growth as the pull rod is retracted. The crystal contains a minor proportion of chromium dispersed throughout its structure.

The product of the foregoing technique, involving the introduction of chromium, is found to be a high quality mono-crystalline compound consisting essentially of gallium arsenide, with a minor proportion of chromium contained therein. When the gallium and the arsenic are of extremely high purity a trace of chromium causes the monocrystalline material to be of surprisingly high resistivity. In the impurity range normally expected from the better commercially available materials, it is found that the presence of at least about 0.2 part per million chromium is advantageous. For example, when about 0.2–0.5 part per million of chromium are present in the final crystalline material, the resistivity is found to be approximately $10^8$ ohm-centimeters. Radically raising the quantity of chromium, for example from the 0.5 part per million level to about 350 parts per million, results in little or no further increase in resistivity.

Now for a better understanding of this invention, the following specific examples should be considered.

*Example 1*

This example is given to show the resistivity characteristics of a high purity gallium arsenide crystal, containing no chromium.

The apparatus shown in the figure was charged with 40 grams of gallium in the alumina cup 65. About 50 grams of metallic elemental arsenic was placed in the bottom of quartz chamber 11, thus providing a slight stoichiometric excess of arsenic. After flushing with argon for about 15 minutes, the side arm 12 was sealed off with a hot torch. Argon was continuously introduced through nipples 53 and 57 to provide an inert atmosphere adjacent sealing surfaces, as previously explained herein. Cooling water circulation was started and maintained through the cooling jacket 31 during the course of processing.

The RF coil 67 was then activated and the temperature of the gallium was raised slowly from room temperature to about 1250° C., the total heating process requiring about 1 hour. Boron nitride lid 13 is heated by resistance coil 19, all during processing, as previously explained herein.

The rod 23 was lowered with its gallium arsenide seed crystal touching the surface of the melt in the alumina cup 65. It was rotated at a spin rate of about 25 revolutions per minute and was then retracted, while rotating, at the pull rate of about 1½" per hour. During the pulling process, the temperature was maintained at about 1240° C., just at the melting point of gallium arsenide. After a crystal of about 1½" in length had been pulled, the retracting rod was manually raised from the melt surface and the apparatus was allowed to cool, the argon flow adjacent the sealing surfaces being maintained so that any gas sucked into the chamber during the cooling process would be inert argon rather than air.

The crystal of gallium arsenide provided to be of good quality and to be substantially pure. It contained about 4 parts per million of aluminum, about 0.09 part per million iron, about 0.05 part per million silicon, about 0.01 part per million magnesium, and somewhat less than about 0.5 part per million calcium. Substantially all remaining material was accounted for as gallium arsenide. The aluminum present in the sample, although to a fairly high level relative to the other impurities, is inactive or neutral in this case. The aluminum resulted from the fact that an alumina crucible was used.

Resistivity measurement of the foregoing crystal gave a value of about 0.1 ohm-centimeter at 300° Kelvin.

Repetition of the above example on several occasions gave a product with a resistivity ranging from about 0.02 to 0.1 ohm-centimeter at 300° Kelvin. In all cases the resulting material was N-type.

*Example 2*

The procedure of Example 1 was repeated, but this time about 100 milligrams of tin were added to the 40-gram charge of gallium and the heating process in the apparatus, accompanied by chemical reaction to form gallium arsenide, was repeated.

The crystal pulled by the same technique, under the same conditions, was quite similar in appearance to the product of Example 1. The mono-crystalline product contained approximately 30 parts per million tin. It will be readily understood that the quantity of tin in the gallium arsenide crystal was substantially reduced from the ratio of tin to gallium in the charge crucible because of segregation phenomena. Except for the tin, substantially the same impurities in approximately the same amounts as in Example 1 were found to be present in the product.

The product was found to have a resistivity of about .01 ohm-centimeter at 300° Kelvin.

*Example 3*

The procedure of Example 2 was repeated; however, in place of the tin 100 milligrams of iron were added to the gallium in alumina cup 65.

The gallium arsenide crystal obtained from the pulling process was found to have a resistivity at 300° Kelvin of about $3\times10^4$ ohm-centimeters. Analysis of the crystal revealed that the actual iron content was approximately 0.5 part per million, the analysis further showing the same impurities in substantially the same amount as in Examples 1 and 2.

*Example 4*

This example and the following examples illustrate practice of the present invention. They are to be contrasted to the results of Examples 1–3, which comparison illustrates a surprising increase in resistivity when chromium is added.

The procedure of Examples 2 and 3 was repeated, except chromium was substituted for the tin and iron employed in those examples. The chromium, of high purity, was introduced into the gallium alumina cup 65. The quantity employed was about 100 milligrams.

After processing and crystal pulling, in accordance with the same technique and under the same conditions employed in the prior examples, a gallium arsenide crystal of monocrystalline structure was obtained of about 1½" in length.

Analysis of the crystal of gallium arsenide showed it to be substantially pure, containing about 4 parts per million of aluminum, 0.05 part per million iron, 0.05 part per million silicon, a trace of magnesium and a trace of calcium. The chromium concentration level was approximately 0.5 part per million.

The resistivity of the product of this example was found to be approximately $3.5\times10^8$ ohm-centimeters at 300° Kelvin.

*Example 5*

The procedure of Example 4 was repeated, but with a charge of about 150 milligrams of chromium in the 40 grams of gallium. The gallium arsenide crystal obtained from the pulling process, all conditions remaining substantially the same as in the prior example, was found to contain about the same concentration level of impurities reported in the prior example, but with a chromium concentration of about 1 part per million. The resistivity of the crystal was approximately $1\times10^8$ ohm-centimeters at 300° Kelvin.

*Example 6*

The prior example was repeated, except the amount of chromium in the charge was about 200 milligrams. The process was conducted under the same conditions as in the prior example, and the resulting gallium arsenide crystal was found to have about the same impurity concentration, with a chromium concentration in the range of about 1.5 parts per million. The resistivity at 300° Kelvin was once again found to be on the order of magnitude of $10^8$ ohm-centimeters.

*Example 7*

The procedure of the prior example was repeated, except chromium was introduced into the gallium in a much higher concentration level, about 1.5 grams of chromium being added to the 40-gram charge of gallium.

The crystal pulling process was operated under the same conditions and the resulting single crystal of gallium arsenide was analyzed. Approximately the same concentration of impurities was found to be present in the crystal. The chromium level was found to be at about 360 parts per million. Notwithstanding this greatly increased quantity of chromium, the resistivity was approximately $10^8$ ohm-centimeters at 300° Kelvin.

*Example 8*

The prior example was repeated, except that the system contained a somewhat higher silicon impurity level, as will be better appreciated from the analysis of the gallium arsenide product given hereinafter, and chromium was introduced in quantity of about 100 milligrams to the 40-gram gallium charge. The gallium arsenide crystal obtained was found to have about the same concentration level of impurities as in prior examples except for the silicon content, which was between 0.2 and 0.3 part per million. The chromium content in the crystal was analyzed at about 0.3 part per million.

It will be noted that the silicon content was about the same as the chromium content. Since silicon acts as an electrically active donor impurity, i.e., in the present environment as a dopant for the gallium arsenide, the impurity dopant level was substantially the same as the chromium level.

The resistivity of the resulting crystal was on the order of $1\times10^{-1}$ ohm-centimeters at room temperature. It thus appears that the chromium level should be in excess of the dopant level of donor type dopant impurities in the system.

Referring to the above examples for comparative purposes, it is seen that the introduction of chromium can increase the resistivity of the crystal by an order of magnitude of 4 over the highest resistivity obtained without it (Example 3, where iron was added).

Moreover, it is noted that once a certain minimum level of chromium was added, the presence of large excess has little effect on the resistivity of the crystal at room temperature. In all instances when a sufficient chromium level was present, resistivity was on the order of $10^8$ ohm-centimeters at room temperature.

It is further seen that chromium should be present in a quantity in excess of residual donor impurities, i.e., chromium should be the dominant of the electrically active impurities.

The examples given above illustrate that for the methods ordinarily used at present to produce gallium arsenide crystals the resulting material is N-type, this being due to residual doping impurities. In this case, the addition of chromium in the specified amounts produces high resistivity gallium arsenide. If the original material would have been P-type, however, the addition of chromium would not result in high resistivity material. This is thought to result from the fact that chromium appears to act as a "deep" or high energy level acceptor and thus does not compensate for a predominance of acceptor impurities, even though the chromium concentration might be far in excess of the acceptor concentration. Accordingly, if the gallium arsenide crystal is expected to turn out to be P-type, then donor impurities should be added to a level in excess of the expected acceptor concentration. The usual donor impurities are sulfur, selenium and tellurium, and the manner of introducing these impurities into the growing crystal is within the state of the art. Then, when chromium is added in excess of the predominant donor concentration, a high resistivity crystal is produced exactly as before.

While the foregoing description has been based on the crystal growth process wherein a crystal is pulled from a gallium arsenide melt, other methods of making gallium arsenide are known and the introduction of chromium into the crystal produced by such other methods likewise results in a high resistivity crystal. For example, the instant invention may be applied by introducing chromium into epitaxially grown layers of monocrystalline gallium arsenide material wherein the gallium arsenide is reduced from gaseous compounds, as with hydrogen, onto a compatible substrate, such as substrate of gallium arsenide. As a further example, chromium may be introduced into a gallium arsenide crystal by diffusion techniques, as by heating chromium and a crystal of gallium arsenide to about 1000° C. in an evacuated system for several hours. Also, chromium may be introduced with the charge into a horizontal gradient freeze apparatus to obtain the crystal of the instant invention. Accordingly, the crystal of the instant invention is not limited to a specific method of manufacture.

It will be understood in this specification, including the claims, that the phrase "electrically active," when used in connection with constituents or impurities, refers to such constituents or impurities that are conductivity-type determining, or conductivity magnitude determining, dopants with respect to gallium arsenide. Thus, "electrically active" impurities are distinguished from neutral impurities. Moreover, when reference is made to a "dominant" quantity of chromium it will be understood that this refers to a quantity of chromium sufficient to mask any substantial electrical effect of other electrically active impurities or constituents in a gallium arsenide crystal, and thus cause the crystal to act, in effect, as if chromium were the only electrically active constituent or impurity present substantially affecting resistivity.

Having described the invention in connection with certain specific embodiments thereof, it is to be understood that further modifications may now suggest themselves to those skilled in the art and it is intended to cover such modifications as fall within the scope of the appended claims.

What is claimed is:

1. A gallium arsenide crystalline material having a dominant electrically active impurity consisting of chromium being present in at least about .2 part per million.

2. The crystal of claim 1 wherein said crystalline material has a resistivity on the order of at least about $10^8$ ohm-centimeters at 300° Kelvin.

3. A high resistivity crystal consisting essentially of a major proportion of gallium arsenide and a minor proportion of electrically active constituents, said minor proportion of electrically active constituents comprising a dominant quantity of chromium.

4. A gallium arsenide crystal having a low level of electrically active impurities present with donor impurities predominating in such active impurities and containing a quantity of chromium in excess of the total quantity of all of said electrically active impurities, said crystal having a resistivity on the order of about $10^8$ ohm-centimeters at 300° Kelvin.

5. In the process of growing a high resistivity crystal of gallium arsenide wherein a minor proportion of electrically active impurities is present with donor impurities predominating, the step of introducing into said growing crystal a quantity of chromium at least as great as a level just in excess of the total quantity of all of said electrically active impurities present.

6. In the process of growing a single crystal of gallium arsenide by pulling said crystal from a melt containing a minor proportion of electrically active impurities, the step of introducing into said melt a quantity of chromium at least as great as the quantity of electrically active impurities present.

References Cited

Properties of Elemental and Compound Semi-Conductors, edited by Gatos, Interscience Publishers, New York 1960, page 49.

TOBIAS E. LEVOW, *Primary Examiner.*

HELEN McCARTHY, *Examiner.*

R. D. EDMONDS, *Assistant Examiner.*